US008035412B2

United States Patent
Choo et al.

(10) Patent No.: US 8,035,412 B2
(45) Date of Patent: Oct. 11, 2011

(54) ON-DIE TERMINATION LATENCY CLOCK CONTROL CIRCUIT AND METHOD OF CONTROLLING THE ON-DIE TERMINATION LATENCY CLOCK

(75) Inventors: Chul-hwan Choo, Paju-si (KR); Jun-bae Kim, Seoul (KR); Yang-ki Kim, Seoul (KR); Jun-ho Shin, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/754,043

(22) Filed: Apr. 5, 2010

(65) Prior Publication Data

US 2010/0259294 A1 Oct. 14, 2010

(30) Foreign Application Priority Data

Apr. 14, 2009 (KR) .................. 10-2009-0032345

(51) Int. Cl.
*H03K 17/16* (2006.01)
*H03K 19/003* (2006.01)

(52) U.S. Cl. ..................... 326/30; 327/117; 327/158

(58) Field of Classification Search ............ 326/30
See application file for complete search history.

(56) References Cited

U.S. PATENT DOCUMENTS

2009/0153186 A1* 6/2009 Oh et al. .................. 326/30
2010/0231275 A1* 9/2010 Kitagawa .................. 327/158

FOREIGN PATENT DOCUMENTS

| KR | 100649975 | 11/2006 |
| KR | 100734087 | 6/2007 |
| KR | 1020080065794 | 7/2008 |

* cited by examiner

*Primary Examiner* — Rexford N Barnie
*Assistant Examiner* — Jany Tran
(74) *Attorney, Agent, or Firm* — F. Chau & Associates, LLC

(57) ABSTRACT

A semiconductor device includes an on-die termination (ODT) latency clock control circuit and an ODT circuit controlled by the ODT latency clock control circuit. The ODT latency clock control circuit includes an ODT enable signal generator receiving an ODT signal input through an ODT pad of the ODT circuit, and generating an ODT enable signal, and an ODT latency clock generator generating a plurality of ODT latency clocks in response to the ODT enable signal. The ODT enable signal includes an enabling period of a first logic level and a disabling period of a second and different logic level, and the ODT enable signal generator generates the ODT enable signal by increasing the width of the enabling period by a predetermined clock cycle and only generating the clocks during the increased enabling period.

20 Claims, 6 Drawing Sheets

ON-DIE TERMINATION LATENCY CLOCK CONTROL CIRCUIT AND METHOD OF CONTROLLING THE ON-DIE TERMINATION LATENCY CLOCK

CROSS-REFERENCE TO RELATED APPLICATIONS

This application claims priority to Korean Patent Application No. 10-2009-0032345, filed on Apr. 14, 2009, in the Korean Intellectual Property Office, the disclosure of which is incorporated by reference in its entirety herein.

BACKGROUND

1. Technical Field

Embodiments of the inventive concept relate to a semiconductor device, and more particularly, to a circuit for controlling an on-die termination latency clock of a semiconductor memory device.

2. Discussion of Related Art

When semiconductor devices operate at high speeds, a swing width of interfaced signals communicated between the devices may be reduced to lessen a delay experienced in the communication. However, reducing the swing width may cause the signals to be more greatly affected by fluctuations in external noise, which may result in mismatching of impedances. The mismatching of impedances may also be caused by a fluctuation in a power voltage, a change in an operation temperature, the manufacturing process, etc.

The mismatching of impedances may adversely affect transmission of data at high speeds or data distortion when data is output from semiconductor devices.

Semiconductor devices that operate at high speeds may include an impedance matching circuit including an on-die termination (ODT). The ODT may receive an ODT signal to trigger an ODT operation therein.

A Dynamic random access memory (DRAM) may include an ODT latency circuit and an ODT latency clock generation circuit to delay the ODT signal. The ODT latency circuit is controlled by ODT latency clocks generated by the ODT latency clock generation circuit.

However, even when an operation of the ODT latency clock generation circuit is unnecessary, the ODT latency clock generation circuit operates, which may increase the amount of power used by the ODT latency circuit and the ODT latency clock generation circuit.

SUMMARY

A semiconductor memory device according to an exemplary embodiment of the inventive concept includes an ODT enable signal generator receiving an ODT signal input through an ODT pad, and generating an ODT enable signal, and an ODT latency clock generator generating a plurality of ODT latency clocks in response to the ODT enable signal.

The ODT enable signal generator may be configured to increase an enabling period of the ODT signal greater than a predetermined clock cycle and generate the ODT enable signal. The ODT latency clock generator may generate the plurality of ODT latency clocks during the enabling period of the ODT enable signal and disable the plurality of ODT latency clocks during the disabling period of the ODT enable signal. The ODT signal may trigger execution of an ODT operation on the semiconductor memory device.

The ODT latency clock control circuit may further include an increaser increasing the enabling period of the ODT enable signal. The ODT latency clock generator may generate the plurality of ODT latency clocks during the enabling period of the ODT enable signal having the increased enabling period and disable the plurality of ODT latency clocks during the disabling period of the ODT enable signal having the increased enabling period.

A method of controlling an ODT latency clock of a semiconductor memory device according to an exemplary embodiment of the inventive concept includes receiving an ODT signal input through an ODT pad and generating an ODT enable signal, and generating a plurality of ODT latency clocks in response to the ODT enable signal.

The generating of the ODT enable signal may include increasing an enabling period of the ODT signal greater than a predetermined clock cycle and generating the ODT enable signal. The generating of the plurality of ODT latency clocks may include generating the plurality of ODT latency clocks during the enabling period of the ODT enable signal, and disabling the plurality of ODT latency clocks during the disabling period of the ODT enable signal.

The method of controlling an ODT latency clock may further include increasing the enabling period of the ODT enable signal. The generating of the plurality of ODT latency clocks may include generating the plurality of ODT latency clocks during the enabling period of the ODT enable signal having the increased enabling period, and disabling the plurality of ODT latency clocks during the disabling period of the ODT enable signal having the increased enabling period.

A semiconductor device according to an exemplary embodiment of the inventive concept includes an on-die termination (ODT) latency clock control circuit, and an ODT circuit controlled by the ODT latency clock control circuit. The ODT latency clock control circuit includes an ODT enable signal generator receiving an ODT signal input through an ODT pad of the ODT circuit, and generating an ODT enable signal, and an ODT latency clock generator generating a plurality of ODT latency clocks in response to the ODT enable signal. The ODT enable signal includes an enabling period of a first logic level and a disabling period of a second and different logic level, and the ODT enable signal generator generates the ODT enable signal by increasing the width of the enabling period by a predetermined clock cycle and only generating the clocks during the increased enabling period.

The ODT enable signal generator may include a clock dividing circuit having a plurality of D-flipflops, where an input and an inverted output of each flipflop are connected together, and a non-inverted output of each flipflop except the last is connected to a clock input of a subsequent flipflop. The D-flip-flops may number five.

The semiconductor device may further include a latch connected to a first inverter, a first NAND gate receiving an output of the first inverter and a signal output by the inverted output of the last flipflop, a second inverter connected to an output of the first NAND gate, a third inverter receiving the ODT signal and connected to the latch, a second NAND gate receiving an output of the second inverter, a fourth inverter receiving an output of the second NAND gate, a first NOR gate receiving the output of the second inverter and the ODT signal, a fifth inverter receiving an output of the NOR gate and outputting the ODT enable signal, a third NAND gate receiving an output of the second inverter, the fourth inverter, and the fifth inverter, and a fourth NAND gate receiving an output of the third NAND gate. The output of the fourth NAND gate may be input to a clock terminal of the first flipflop. The output of the second NAND gate may be input to a reset terminal of the last flip-flop.

The ODT circuit may include a latency processor receiving the ODT latency clocks and the ODT signal and delaying the ODT signal based on the received clocks to generate a delayed ODT signal, a repeater receiving the delayed ODT signal and generating an upper control signal and a lower control signal from the delayed ODT signal, and an output driver configured to apply one of a first voltage to an output pad, a second and different voltage to the output pad, or both the first and second voltage to the output pad based on the upper and lower control signals. The ODT enable signal may be NOR'ed with the delayed ODT signal before being applied to the ODT latency clock generator.

The output driver may include a PMOS transistor connected between a first resistor receiving the first voltage and the output pad and a gate terminal of the PMOS transistor receives the upper control signal, and an NMOS transistor connected between a second resistor receiving the second voltage and the output pad and a gate terminal of the NMOS transistor receivers the lower control signal.

BRIEF DESCRIPTION OF THE DRAWINGS

Exemplary embodiments of the inventive concept will be more clearly understood from the following detailed description, taken in conjunction with the accompanying drawings in which.

DETAILED DESCRIPTION OF EXEMPLARY EMBODIMENTS

Figure 1:
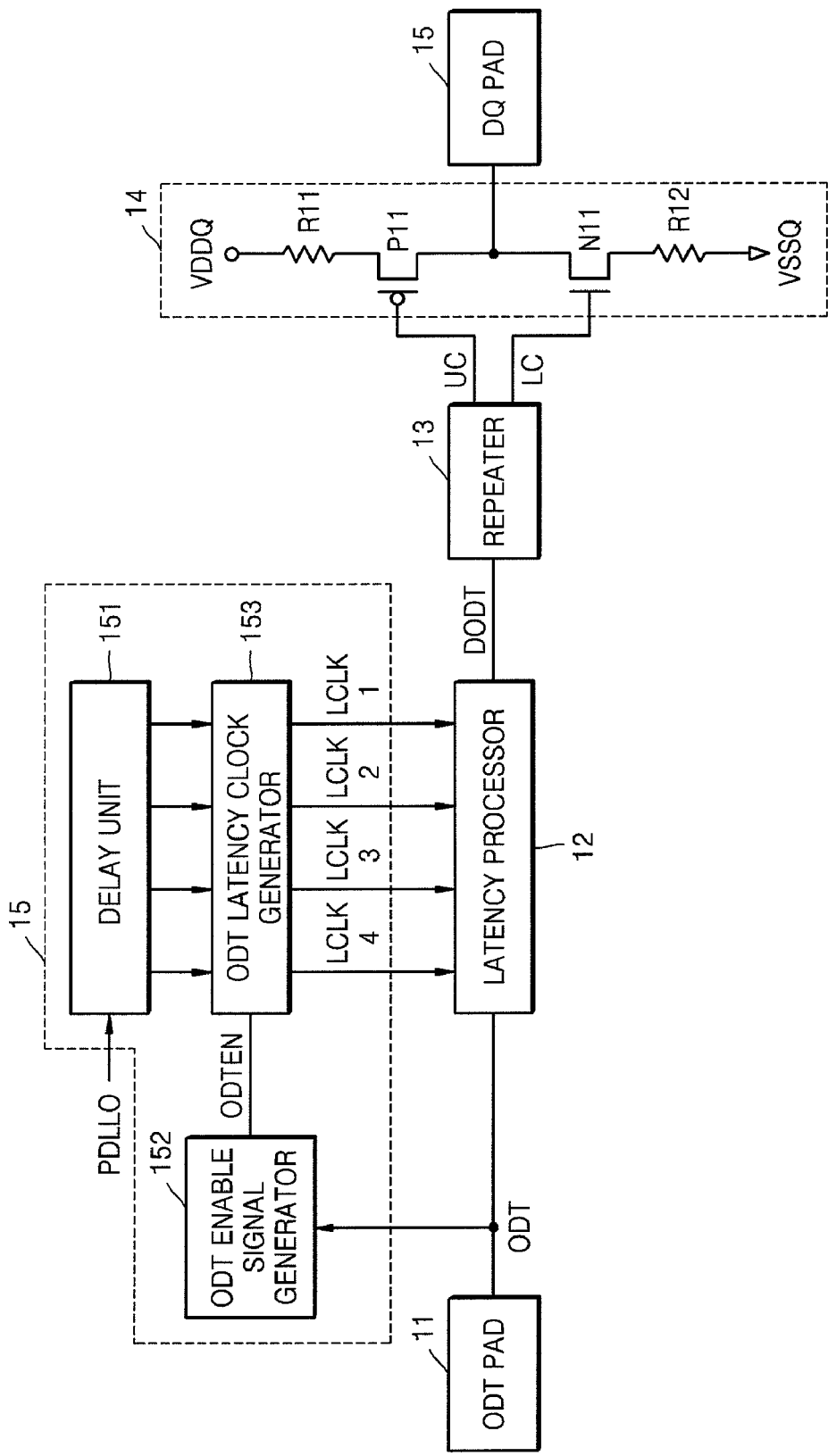
FIG. 1 is a block circuit diagram of an on-die termination (ODT) latency clock control circuit and an ODT circuit controlled by the ODT latency clock control circuit according to an exemplary embodiment of the inventive concept.

The inventive concept will now be described more fully with reference to the accompanying drawings, in which exemplary embodiments thereof are shown. Like reference numerals in the drawings denote like elements.

FIG. 1 is a block circuit diagram of an on-die termination (ODT) latency clock control circuit and an ODT circuit controlled by the ODT latency clock control circuit according to an exemplary embodiment of the inventive concept. The circuit may be used within a DRAM (e.g., a double-data-rate three synchronous dynamic random access memory (DDR3 DRAM).

Referring to FIG. 1, the ODT circuit includes an ODT pad 11, a latency processor 12, a repeater 13, an output driver 14, and a data input/output pad 15 (e.g., a DQ PD). An ODT signal ODT (e.g., a signal for instructing or triggering an ODT operation) is input through the ODT pad 11. The latency processor 12 delays the ODT signal ODT by a predetermined period of time. Times for enabling and disabling an ODT operation of a DDR3 DRAM may be based on a column address strobe (CAS) write latency (CWL) and an additive latency (AL). For example, the times may be set according to the Joint Electron Devices Engineering Council (JEDEC) specification, which specifies an equation of a column address strobe (CAS) write latency (CWL)+an additive latency (AL)−a constant (e.g., 2). For example, if the ODT signal ODT input through the ODT pad 11 is enabled, a first ODT resistor R11 and/or a second ODT resistor R12 are connected to the data input/output pad 15 after a number of clocks corresponding to the CWL+AL−2 have elapsed. If the ODT signal ODT is disabled, the first ODT resistor R11 and/or the second ODT resistor R12 are disconnected from the data input/output pad 15 after the number of clocks corresponding to the CWL+AL−2 have elapsed. Thus, the latency processor 12 delays the ODT signal ODT input through the ODT pad 11.

The repeater 13 buffers an output signal DODT of the latency processor 12 (e.g., an ODT driving enable signal). The output driver 14 drives the data input/output pad 15 in response to output signals UC and LC of the repeater 13, and includes the first ODT resistor R11, the second ODT resistor R12, a PMOS transistor P11, and an NMOS transistor N11. When the output signals UC and LC of the repeater 13 are logic low, the PMOS transistor P11 is turned on, and the NMOS transistor N11 is turned off, and thus the first ODT resistor R11 is connected to the data input/output pad 15. When the output signals UC and LC of the repeater 13 are logic high, the PMOS transistor P11 is turned off, and the NMOS transistor N11 is turned on, and thus the second ODT resistor R12 is connected to the data input/output pad 15. When the output signal UC of the repeater 13 is logic low and the output signal LC of the repeater 13 is logic high, the PMOS transistor P11 and the NMOS transistor N11 are turned on, and thus the first and second ODT resistors R11 and R12 are connected to the data input/output pad 15. In an alternate embodiment, the transistors may be swapped and thus signals complimentary to those discussed above for output signals UC and LC may be used. Further, the transistors may be of the same type (e.g., both PMOS and both NMOS), and thus the output signals UC and LC need only be adjusted accordingly.

The latency processor 12 is controlled by the ODT latency clock control circuit 15. The ODT latency clock control circuit 15 includes a delay unit 151, an ODT enable signal generation circuit 152, and an ODT latency clock generator 153.

The delay unit 151 may include a plurality of unit delayers, delays an output signal PDLLO, and outputs basic clocks to the ODT latency clock generator 153. The output signal may be output by a delay locked loop (DLL) included in the DRAM. The ODT enable signal generation circuit 152 receives the ODT signal ODT input through the ODT pad 11 of the DRAM (e.g., a semiconductor memory device) and generates an ODT enable signal ODTEN. The ODT enable signal generation circuit 152 increases an enabling period of the ODT signal ODT greater than a predetermined clock cycle and generates the ODT enable signal ODTEN having the increased enabling period.

The ODT latency clock generator 153 receives the basic clocks from the delay unit 151 and generates a plurality of ODT latency clocks LCLK1-LCLK4 in response to the ODT enable signal ODTEN. The ODT latency clock generator 153 includes a plurality of delay paths used to adjust a clock timing that varies according to the CWL.

The ODT latency clock generator 153 may be controlled by a signal TERMON indicating whether the ODT is powered on/off, instead of the ODT enable signal ODTEN generated by using the ODT signal ODT. The signal TERMON indicating whether the ODT is powered on/off may be applied to a JEDEC mode resistor set (MRS) of the DRAM. When the signal TERMON indicating whether the ODT is powered on/off is enabled (e.g., a logic high), the ODT latency clock generation circuit 153 operates. When the signal indicating whether the ODT is powered on/off is disabled (e.g., a logic low), the ODT latency clock generation circuit 153 is disabled.

Figure 2:
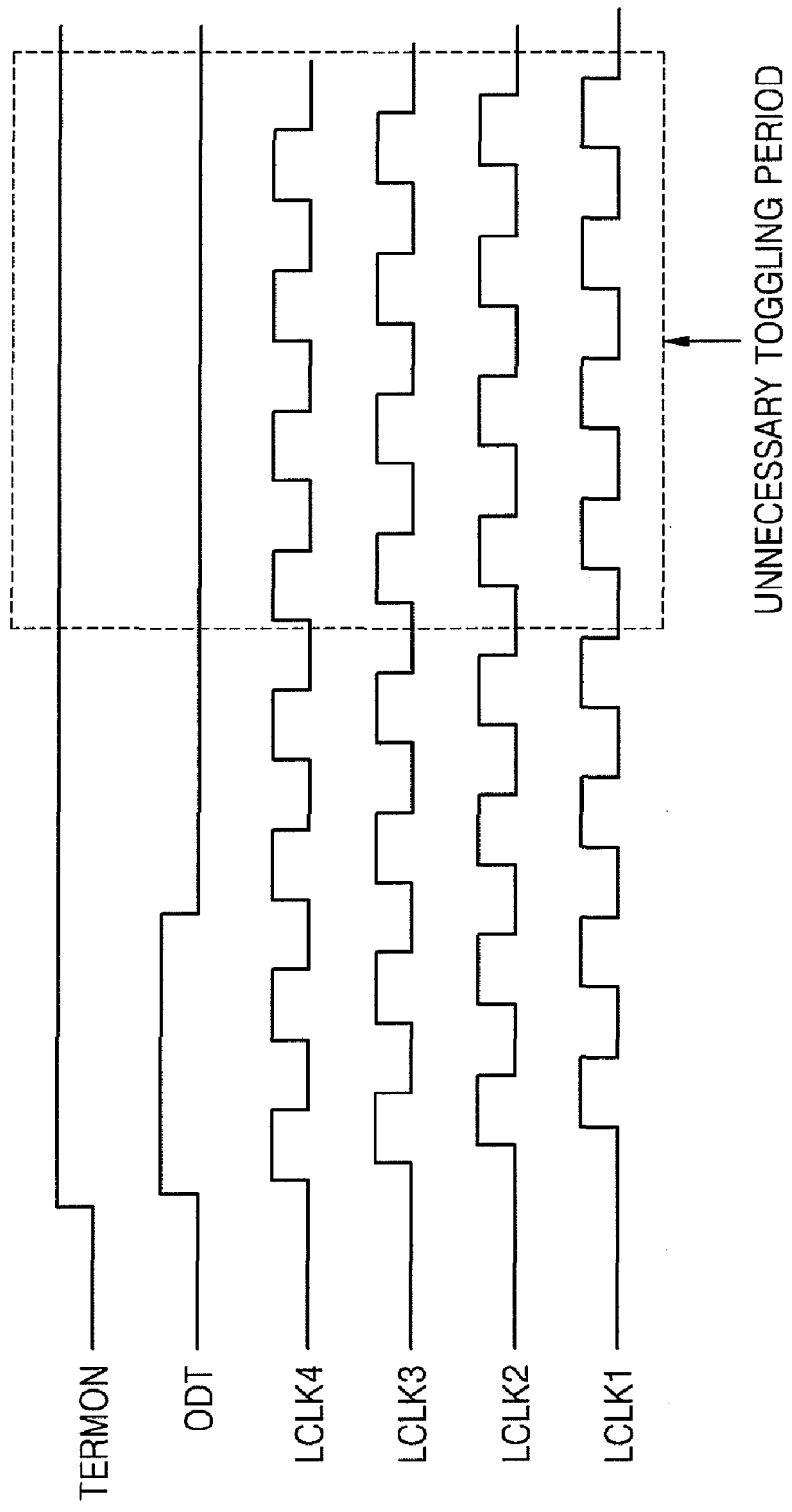
FIG. 2 is an exemplary timing diagram of an ODT signal and a plurality of ODT latency clocks when an ODT latency clock generator is controlled by a signal indicating whether the ODT is powered on/off.

FIG. 2 is an exemplary timing diagram of the ODT signal ODT and the ODT latency clocks LCLK1-LCLK4 when the ODT latency clock generator 153 is controlled by the signal TERMON indicating whether the ODT is powered on/off according to an exemplary embodiment of the inventive concept.

Referring to FIG. 2, the ODT operation is not always performed during a logic high period of the signal TERMON indicating whether the ODT is powered on/off. For example, the ODT signal may be disabled (e.g., a logic low) when the signal TERMON is enabled (e.g., a logic high). Thus, the ODT latency clock generator 153 may not operate always during the logic high period of the signal TERMON. However, when the ODT latency clock generator 153 is controlled by the signal TERMON, the ODT latency clock generator 153 continuously operates while the signal TERMON is enabled (e.g., at a logic high), so that the ODT latency clocks LCLK1-LCLK4 continuously toggle, which causes an unnecessary toggling period. Thus, power consumption of the ODT latency clock generator 153 and the latency processor 12 controlled by the ODT latency clocks LCLK1-LCLK4 increases during the generation of the ODT latency clocks LCLK1-LCLK4.

When the ODT latency clock generator 153 is controlled by the ODT signal ODT input through the ODT pad 11, the latency processor 12 does not properly perform a latency operation since the ODT latency clocks LCLK1-LCLK4 are disabled during the logic low period of the ODT signal ODT and thus the latency processor 12 does not properly delay the ODT signal ODT. Since the ODT signal ODT should be delayed until a desired clock cycle through the latency processor 12 has lapsed, the ODT latency clocks LCLK1-LCLK4 should be enabled until the ODT operation ends.

Therefore, the ODT latency clock generator 153 of the ODT latency clock control circuit 15 in at least one embodiment of the inventive concept is controlled by the ODT enable signal ODTEN having the increased enabling period compared to the ODT signal ODT.

Figure 3:
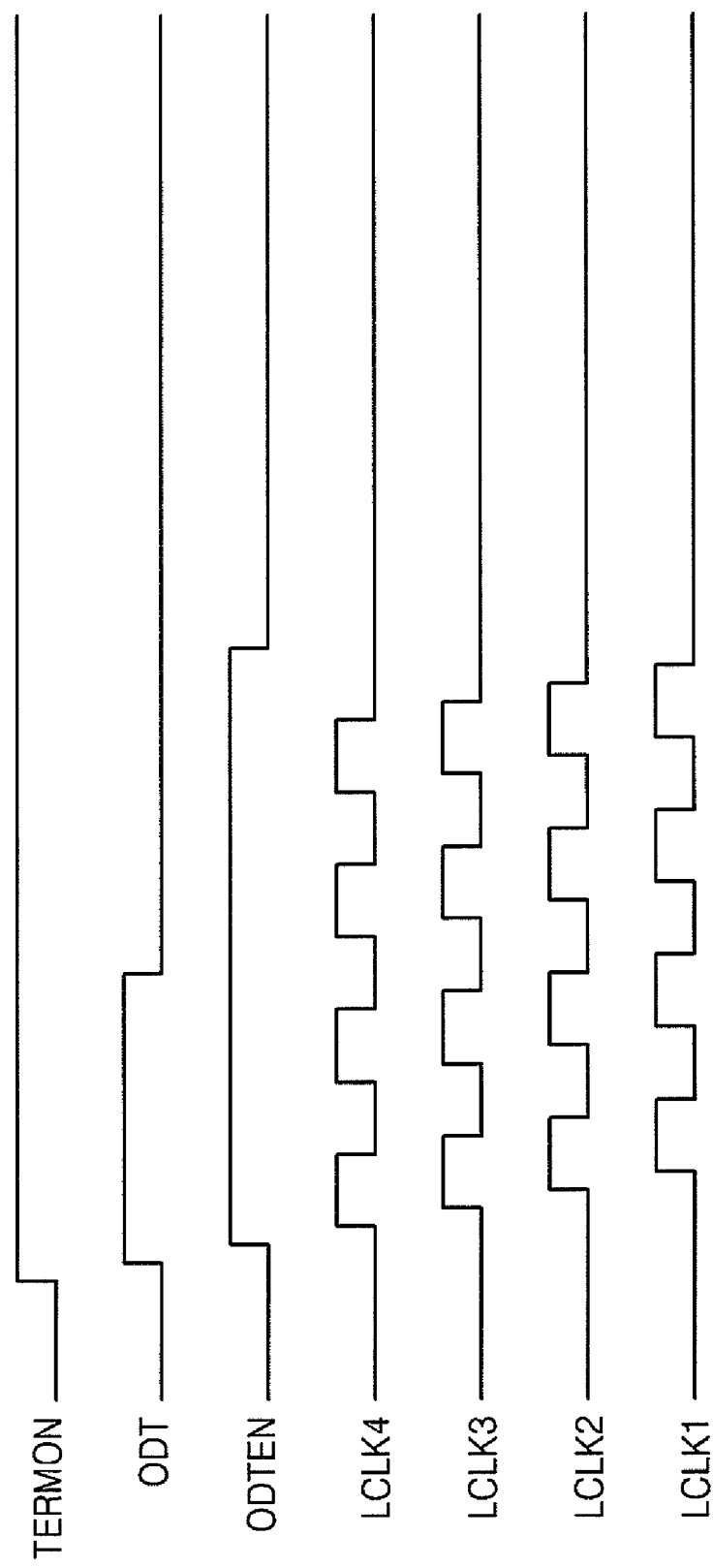
FIG. 3 is an exemplary timing diagram of the ODT latency clock control circuit of FIG. 1.

FIG. 3 is an exemplary timing diagram of the ODT latency clock control circuit 15. A method of controlling an ODT latency clock performed by the ODT latency clock control circuit 15 will now be described with reference to FIG. 3 according to an exemplar embodiment of the inventive concept.

After the signal TERMON indicating whether the ODT is powered on/off is applied to the JEDEC MRS of the DRAM, if the ODT signal ODT is input through the ODT pad 11, the ODT enable signal generation circuit 152 generates the ODT enable signal ODTEN. The ODT enable signal generation circuit 152 increases an enabling period of the ODT signal ODT greater than a predetermined clock cycle and generates the ODT enable signal ODTEN having the increased enabling period.

The ODT latency clock generator 153 receives the basic clocks from the delay unit 151 and generates the ODT latency clocks LCLK1-LCLK4 in response to the ODT enable signal ODTEN. For example, the ODT latency clock generator 153 generates the ODT latency clocks LCLK1-LCLK4 when the ODT enable signal ODTEN is enabled, and disables the ODT latency clocks LCLK1-LCLK4 when the ODT enable signal ODTEN is disabled.

As described above, the method of controlling the ODT latency clock performed by the ODT latency clock control circuit 15 controls the ODT latency clock generator 153 by using the ODT enable signal ODTEN so that the ODT latency clock generator 153 does not always operate during the logic high period of the signal TERMON and operates during the logic high period of the ODT enable signal ODTEN. Thus, the ODT latency clock generator 153 does not operate during the logic low period of the ODT enable signal ODTEN and the ODT latency clocks LCLK1-LCLK4 are disabled. For example, the ODT latency clocks LCLK1-LCLK4 toggle only during the ODT operation and vice versa.

Therefore, the power consumption of the ODT latency clock generator 153 that generates the ODT latency clocks LCLK1-LCLK4 and the latency processor 12 controlled by the ODT latency clocks LCLK1-LCLK4 may be reduced.

Figure 4:
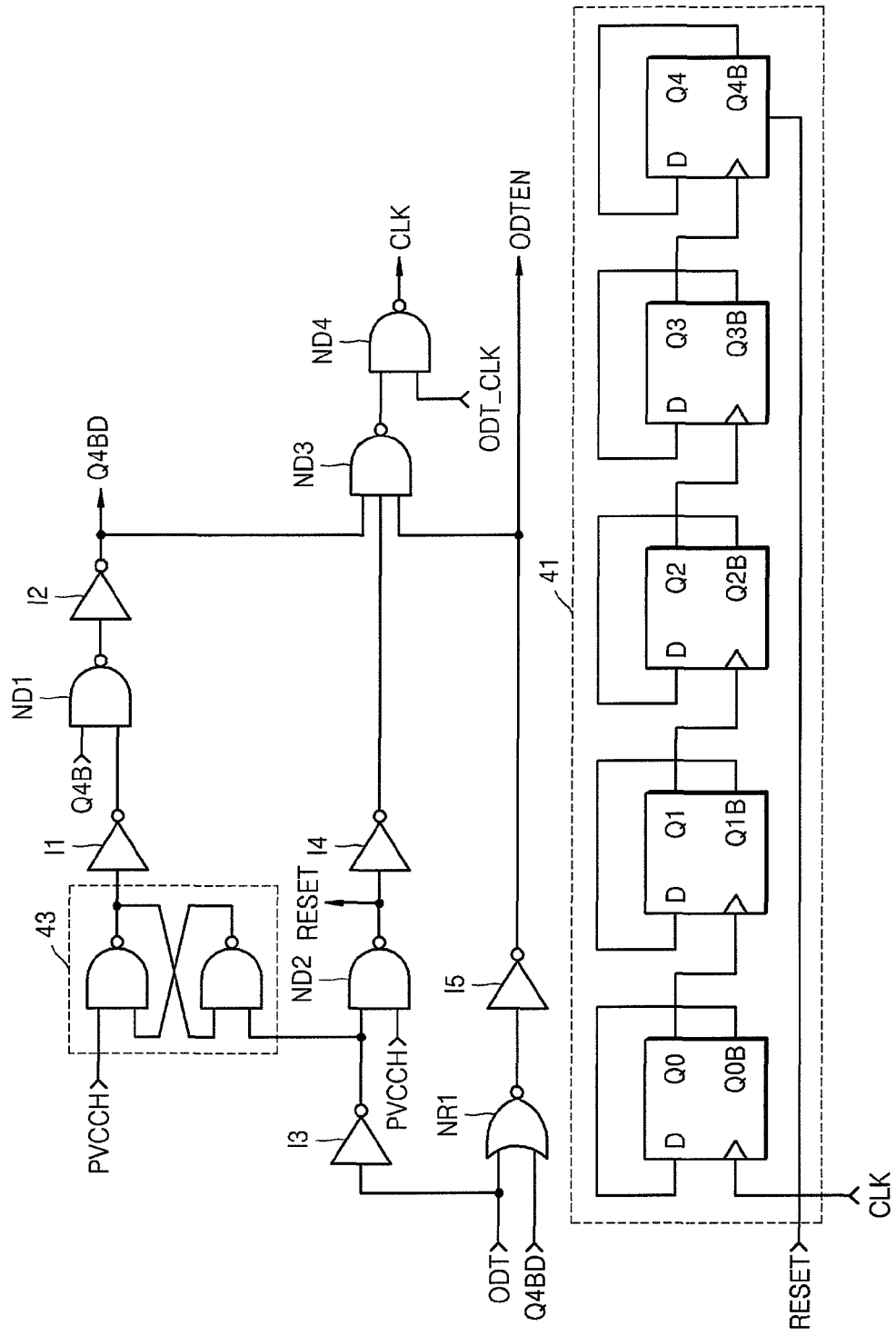
FIG. 4 is a circuit diagram of the ODT enable signal generation circuit of FIG. 1 according to an exemplary embodiment of the inventive concept.
Figure 5:
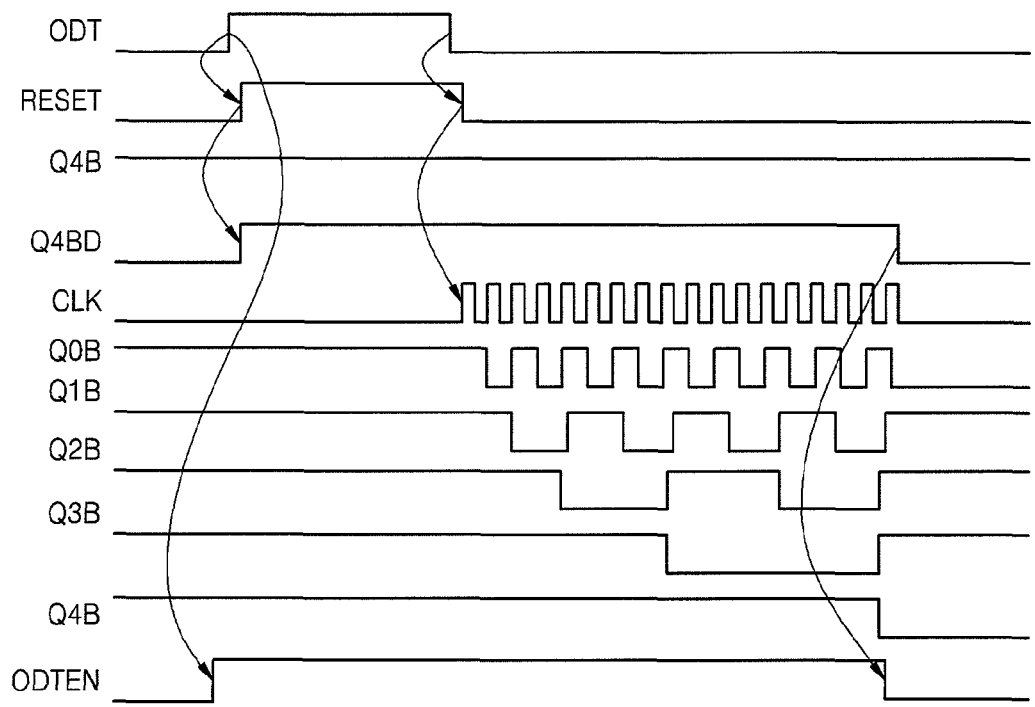
FIG. 5 is an exemplary timing diagram of the ODT enable signal generation circuit of FIG. 4.

FIG. 4 is a circuit diagram of the ODT enable signal generation circuit 152 according to an exemplary embodiment of the inventive concept. FIG. 5 is an exemplary timing diagram of the ODT enable signal generation circuit 152.

Referring to FIG. 4, the ODT enable signal generation circuit 152 uses a clock dividing circuit 41 to generate the ODT enable signal ODTEN having the increased enabling period compared to the ODT signal ODT. While the clock dividing circuit 41 is illustrated as including five D-flipflops chained together, the circuit is not limited thereto. For example, other types of flipflops may be used and a fewer or greater number of flipflops may be used. The ODT enable signal generation circuit 152 includes the clock dividing circuit 41, a latch 43, a plurality of NAND gates ND1-ND4, a NOR gate NR1, and a plurality of inverters I1-I5.

The clock dividing circuit 41 may include a plurality of D-flipflops (e.g., 5), where an input and an inverted output of each flipflop are connected together, and a non-inverted output of each flipflop except the last is connected to a clock input of a subsequent flipflop. The latch 43 may be connected to a first inverter I1. A first NAND gate ND1 may receive an output of the first inverter I1 and a signal output by the inverted output of the last flipflop (e.g., Q4B). The second inverter I2 may be connected to an output of the first NAND gate ND1 to generate a delayed signal Q4BD. The third inverter I3 may receive the ODT signal and is connected to the latch 43. The second NAND gate ND2 may receive an output of the second inverter I2 and initialization signal PVCCH to generate a reset signal RESET. The fourth inverter I4 may receive an output of the second NAND gate ND2. The NOR gate NR1 may receive the ODT signal and the delayed signal Q4BD. The fifth inverter I5 may receive an output of the NOR NR1 gate and output the ODT enable signal ODTEN. The third NAND gate ND3 may receive an output of the second inverter I2, the fourth inverter I4, and the fifth inverter I5. The fourth NAND gate ND4 may receive an output of the third NAND gate ND3 and clock signal ODT_CLK. The output of the fourth NAND gate ND4 may be input to a clock terminal of the first flipflop. The output of the second NAND gate ND2 may be input to a reset terminal of the last flip-flop.

The initialization signal PVCCH may be an externally applied signal. The clock signal ODT_CLK may be an externally applied signal. If the ODT signal ODT is logic high, the reset signal RESET is logic high, and thus flipflops of the clock dividing circuit 41 do not operate. Thereafter, if the ODT signal ODT is logic low, the reset signal RESET is logic low, and thus the flipflops of the clock dividing circuit 41 operate. The logic high period (the enabling period) of the ODT signal ODT increases until an output signal Q4B of the final flipflop is logic low, so that the ODT enable signal ODTEN having the increased enabling period is generated.

As discussed above, times for enabling and disabling an ODT operation of a DDR3 DRAM according to the JEDEC specification may be determined according to the equation of CWL+AL−2. For example, the logic high (enabling) period of the ODT signal ODT input through the ODT pad 11 may be a CWL+AL−2 number of clock cycles to secure a delay of the AL and CWL. According to the current specification of DDR3 DRAM, since the maximum delay values of the CWL and AL are 10 and 13, respectively, the logic high (enabling) period of the ODT signal ODT should be greater than 23 cycles. Thus, the clock dividing circuit 41 may divide the clock CLK 5 times, and thus the ODT latency clocks LCLK1-LCLK4 may be enabled during the operation of the latency processor 12.

Figure 6:
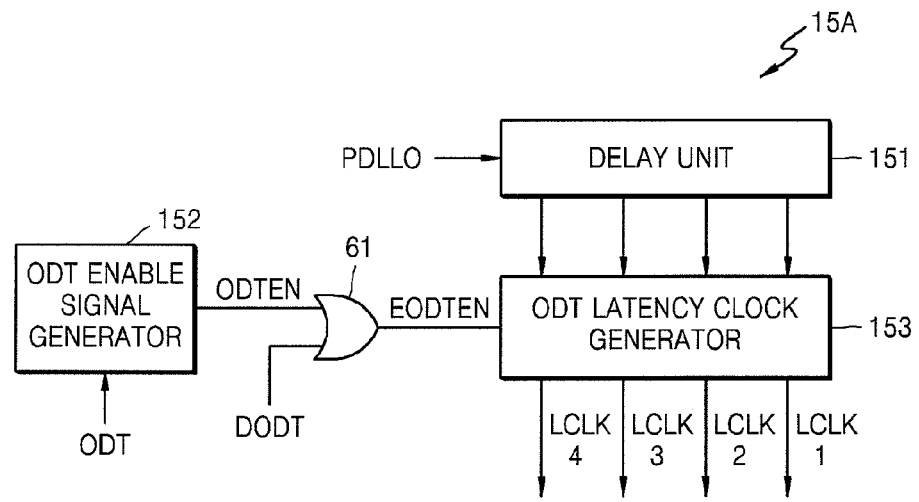
FIG. 6 is a block circuit diagram of an ODT latency clock control circuit according to an exemplary embodiment of the inventive concept.
Figure 7:
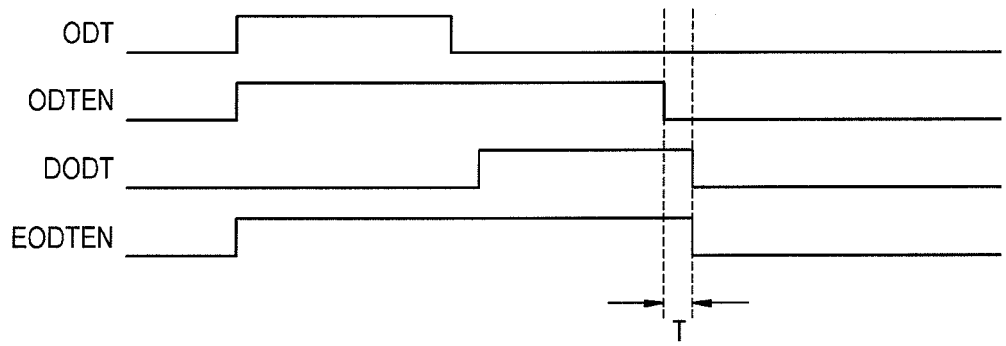
FIG. 7 is an exemplary timing diagram of the ODT latency clock control circuit of FIG. 6.

FIG. 6 is a block circuit diagram of an ODT latency clock control circuit 15A according to an exemplary embodiment of the inventive concept. FIG. 7 is an exemplary timing diagram of the ODT latency clock control circuit 15A.

Referring to FIG. 6, the ODT latency clock control circuit 15A further includes an increaser 61 that increases an enabling period of the ODT enable signal ODTEN, in addition to the delay unit 151, the ODT enable signal generation circuit 152, and the ODT latency clock generator 153.

The delay unit 151, the ODT enable signal generation circuit 152, and the ODT latency clock generator 153 are the same as described with reference to FIGS. 1 through 5. The increaser 61 may include an OR gate, and generates an ODT enable signal EODTEN having an enabling (logic high) period increased by a predetermined period of time T by receiving the ODT enable signal ODTEN generated by the ODT enable signal generation circuit 152 and the output signal DODT of the latency processor 12 shown in FIG. 1.

The ODT latency clock generator 153 generates the ODT latency clocks LCLK1-LCLK4 during the enabling period of the ODT enable signal EODTEN, and disables the ODT latency clocks LCLK1-LCLK4 during the disabling period of the ODT enable signal EODTEN.

For example, ODT operations may include a synchronous ODT operation and an asynchronous ODT operation. An ODT enable signal may not normally operate during a period where the synchronous ODT operation transitions to the asynchronous ODT operation or vice versa. Therefore, the increaser 61 sums the ODT signal ODT, the ODT enable signal ODTEN, and the output signal DODT of the latency processor 12, and generates the ODT enable signal EODTEN having the increased enabling (logic high) period. The ODT latency clock generator 153 may be controlled by the ODT enable signal EODTEN.

While the inventive concept has been particularly shown and described with reference to exemplary embodiments thereof, it will be understood that various changes in form and details may be made therein without departing from the spirit and scope of the disclosure.

What is claimed is:

1. An on-die termination (ODT) latency clock control circuit of a semiconductor memory device comprising:
    an ODT enable signal generator receiving an ODT signal input through an ODT pad, and generating an ODT enable signal by increasing an enabling period of the ODT signal greater than a predetermined clock cycle; and
    an ODT latency clock generator generating a plurality of ODT latency clocks in response to the ODT enable signal,
    wherein the ODT enable signal generator uses a clock dividing circuit dividing a clock signal.

2. The ODT latency clock control circuit of claim 1, wherein the ODT latency clock generator generates the plurality of ODT latency clocks during the enabling period of the ODT enable signal and disables the plurality of ODT latency clocks during a disabling period of the ODT enable signal.

3. The ODT latency clock control circuit of claim 1, wherein the ODT signal triggers execution of an ODT operation on the semiconductor memory device.

4. The ODT latency clock control circuit of claim 1, wherein the ODT latency clock generator generates the plurality of ODT latency clocks during the enabling period of the ODT enable signal having the increased enabling period and disables the plurality of ODT latency clocks during the disabling period of the ODT enable signal having the increased enabling period.

5. A method of controlling an ODT latency clock of a semiconductor memory device, the method comprising:
    receiving an ODT signal input through an ODT pad;
    using clock dividing circuit to divide a clock signal;
    generating an ODT enable signal from the ODT signal and the divided clock signal; and
    generating a plurality of ODT latency clocks in response to the ODT enable signal.

6. The method of claim 5, wherein the generating of the ODT enable signal comprises: increasing an enabling period of the ODT signal greater than a predetermined clock cycle and generating the ODT enable signal.

7. The method of claim 5, wherein the generating of the plurality of ODT latency clocks comprises:
    generating the plurality of ODT latency clocks during the enabling period of the ODT enable signal; and
    disabling the plurality of ODT latency clocks during the disabling period of the ODT enable signal.

8. The method of claim 5, further comprising: increasing the enabling period of the ODT enable signal,
    wherein the generating of the plurality of ODT latency clocks comprises:
    generating the plurality of ODT latency clocks during the enabling period of the ODT enable signal having the increased enabling period; and
    disabling the plurality of ODT latency clocks during the disabling period of the ODT enable signal having the increased enabling period.

9. The method of claim 5, wherein the ODT signal triggers execution of an ODT operation on the semiconductor memory device.

10. A semiconductor device comprising:
    an on-die termination (ODT) latency clock control circuit; and
    an ODT circuit controlled by the ODT latency clock control circuit,
    wherein the ODT latency clock control circuit comprises:
    an ODT enable signal generator receiving an ODT signal input through an ODT pad of the ODT circuit, and generating an ODT enable signal; and
    an ODT latency clock generator generating a plurality of ODT latency clocks in response to the ODT enable signal,
    wherein the ODT enable signal includes an enabling period of a first logic level and a disabling period of a second and different logic level, and the ODT enable signal generator generates the ODT enable signal by increasing the width of the enabling period by a predetermined clock cycle and only generating the clocks during the increased enabling period.

11. The semiconductor device of claim 10, wherein the ODT enable signal generator comprises a clock dividing circuit comprising a plurality of D-flipflops, wherein an input and an inverted output of each flipflop are connected together, and a non-inverted output of each flipflop except the last is connected to a clock input of a subsequent flip-flop.

12. The semiconductor device of claim 11, wherein the D-flipflops number five.

13. The semiconductor device of claim 11, further comprising:
   a latch connected to a first inverter;
   a first NAND gate receiving an output of the first inverter and a signal output by the inverted output of the last flip-flop;
   a second inverter connected to an output of the first NAND gate;
   a third inverter receiving the ODT signal and connected to the latch;
   a second NAND gate receiving an output of the second inverter;
   a fourth inverter receiving an output of the second NAND gate;
   a NOR gate receiving the output of the second inverter and the ODT signal;
   a fifth inverter receiving an output of the NOR gate and outputting the ODT enable signal;
   a third NAND gate receiving an output of the second inverter, the fourth inverter, and the fifth inverter; and
   a fourth NAND gate receiving an output of the third NAND gate.

14. The semiconductor device of claim 13, wherein the output of the fourth NAND gate is input to a clock terminal of the first flip-flop.

15. The semiconductor device of claim 14, wherein the output of the second NAND gate is input to a reset terminal of the last flip-flop.

16. The semiconductor device of claim 10, wherein the ODT circuit comprises:
   a latency processor receiving the ODT latency clocks and the ODT signal and delaying the ODT signal based on the received clocks to generate a delayed ODT signal;
   a repeater receiving the delayed ODT signal and generating an upper control signal and a lower control signal from the delayed ODT signal; and
   an output driver configured to apply one of a first voltage to an output pad, a second and different voltage to the output pad, or both the first and second voltage to the output pad based on the upper and lower control signals.

17. The semiconductor device of claim 16, wherein the ODT enable signal is NOR'ed with the delayed ODT signal before being applied to the ODT latency clock generator.

18. The semiconductor device of claim 16, wherein the output driver comprises:
   a PMOS transistor connected between a first resistor receiving the first voltage and the output pad and a gate terminal of the PMOS transistor receives the upper control signal; and
   an NMOS transistor connected between a second resistor receiving the second voltage and the output pad and a gate terminal of the NMOS transistor receivers the lower control signal.

19. An on-die termination (ODT) latency clock control circuit of a semiconductor memory device comprising:
   an ODT enable signal generator receiving an ODT signal input through an ODT pad, generating an ODT enable signal;
   an ODT latency clock generator generating a plurality of ODT latency clocks in response to the ODT enable signal; and
   an increaser increasing the enabling period of the ODT enable signal,
   wherein the ODT latency clock generator generates the plurality of ODT latency clocks during the enabling period of the ODT enable signal having the increased enabling period and disables the plurality of ODT latency clocks during the disabling period of the ODT enable signal having the increased enabling period.

20. A method of controlling an ODT latency clock of a semiconductor memory device, the method comprising:
   receiving an ODT signal input through an ODT pad and generating an ODT enable signal;
   generating a plurality of ODT latency clocks in response to the ODT enable signal; and
   increasing the enabling period of the ODT enable signal,
   wherein the generating of the plurality of ODT latency clocks comprises:
      generating the plurality of ODT latency clocks during the enabling period of the ODT enable signal having the increased enabling period; and
      disabling the plurality of ODT latency clocks during the disabling period of the ODT enable signal having the increased enabling period.

* * * * *